United States Patent
Burns et al.

(10) Patent No.: US 9,860,093 B2
(45) Date of Patent: Jan. 2, 2018

(54) FREQUENCY SHIFT KEYING MODULATION AND DEMODULATION

(75) Inventors: Kenneth Burns, North Canton, OH (US); Kenneth Malecek, Willoughby Hills, OH (US)

(73) Assignee: PEPPER+FUCHS GMBH, Mannheim (DE)

( * ) Notice: Subject to any disclaimer, the term of this patent is extended or adjusted under 35 U.S.C. 154(b) by 0 days.

(21) Appl. No.: 13/698,912

(22) PCT Filed: Mar. 19, 2011

(86) PCT No.: PCT/US2011/029110
§ 371 (c)(1),
(2), (4) Date: Nov. 19, 2012

(87) PCT Pub. No.: WO2011/116362
PCT Pub. Date: Sep. 22, 2011

(65) Prior Publication Data
US 2013/0107919 A1    May 2, 2013

Related U.S. Application Data

(60) Provisional application No. 61/315,387, filed on Mar. 18, 2010.

(51) Int. Cl.
  *H04L 27/10* (2006.01)
  *H03K 7/06* (2006.01)
(52) U.S. Cl.
  CPC .............. *H04L 27/10* (2013.01); *H03K 7/06* (2013.01)

(58) Field of Classification Search
  CPC ... H04L 27/10; H04L 27/106; H04L 27/2331; H04L 2025/03394; H04L 27/122; H04L 12/40; H04B 3/04; H04B 3/54
  See application file for complete search history.

(56) References Cited

U.S. PATENT DOCUMENTS 3,571,712 A  *  3/1971  Hellwarth et al. ............ 375/328
5,040,192 A      8/1991  Tjahjadi
(Continued)

FOREIGN PATENT DOCUMENTS

EP      0084461 A1    7/1983
WO    2006/025918 A2  3/2006

OTHER PUBLICATIONS

Dennis Seguine, Simplified FSK Signal Detction, Circuit Cellar, Issue 194, Sep. 2006.*

(Continued)

*Primary Examiner* — Aristocratis Fotakis
(74) *Attorney, Agent, or Firm* — Thompson Hine LLP

(57) ABSTRACT

A communications adaptor comprises a receiver circuit, which can comprise a signal input configured to receive a frequency shift keyed (FSK) signal; a delay circuit in communication with the signal input and including a delayed signal output; a multiplier circuit in communication with the signal input and the delayed signal output, and the multiplier circuit can be configured to produce a serial bit steam from at least the signal input and the delayed signal output, the serial bit stream corresponds to one or more bits encoded with frequency shift keying in the FSK signal; and a signal output configured to output the serial bit stream. The communications adaptor also can comprise a transmitter circuit and a processor in communication with the receiver circuit and the transmitter circuit.

14 Claims, 5 Drawing Sheets

(56) References Cited

U.S. PATENT DOCUMENTS

| | | | |
|---|---|---|---|
| 5,313,492 | A | 5/1994 | Hashimoto et al. |
| 5,789,991 | A * | 8/1998 | Ishii .............................. 332/100 |
| 5,959,372 | A | 9/1999 | Every |
| 5,977,749 | A | 11/1999 | Kim |
| 6,295,272 | B1 | 9/2001 | Feldman et al. |
| 6,304,978 | B1 | 10/2001 | Horigan et al. |
| 6,677,824 | B2 | 1/2004 | Harpham |
| 7,057,543 | B2 * | 6/2006 | Hamilton et al. ............ 341/147 |
| 7,593,642 | B2 | 9/2009 | Loechner |
| 8,258,749 | B2 | 9/2012 | Sinreich |
| 8,280,317 | B2 | 10/2012 | Sinreich |
| 9,203,665 | B1 * | 12/2015 | Haran ...................... H04B 3/04 |
| 9,625,895 | B2 | 4/2017 | Sinreich |
| 2001/0017572 | A1 | 8/2001 | Harpham |
| 2002/0198648 | A1 | 12/2002 | Gilbreth et al. |
| 2003/0075993 | A1 | 4/2003 | Fadell et al. |
| 2004/0071157 | A1 | 4/2004 | Feldman et al. |
| 2004/0113814 | A1 * | 6/2004 | Lochner ................. G08C 19/02 340/870.18 |
| 2004/0158334 | A1 | 8/2004 | Kirkpatrick et al. |
| 2005/0191983 | A1 * | 9/2005 | Korner .......................... 455/280 |
| 2005/0242979 | A1 * | 11/2005 | Hamilton .......... H04L 25/03834 341/144 |
| 2005/0245291 | A1 | 11/2005 | Brown et al. |
| 2005/0289276 | A1 | 12/2005 | Karschnia et al. |
| 2006/0092039 | A1 | 5/2006 | Saito et al. |
| 2007/0053466 | A1 * | 3/2007 | Klostermann ................ 375/316 |
| 2007/0063833 | A1 | 3/2007 | Kates |
| 2008/0151973 | A1 * | 6/2008 | Calvin .......................... 375/216 |
| 2009/0081957 | A1 | 3/2009 | Sinreich |
| 2009/0109885 | A1 * | 4/2009 | Fonseca et al. ............. 370/311 |
| 2009/0146502 | A1 | 6/2009 | Sinreich |
| 2010/0061733 | A1 | 3/2010 | Loechner |
| 2010/0079083 | A1 * | 4/2010 | Seguine ............. H05B 37/0254 315/292 |
| 2012/0326525 | A1 | 12/2012 | Sinreich |
| 2013/0029533 | A1 | 1/2013 | Sinreich |
| 2015/0030089 | A1 * | 1/2015 | Alley ................ H04L 12/40032 375/258 |
| 2015/0061634 | A1 * | 3/2015 | Eisenbeis ................. H02H 9/04 323/299 |
| 2015/0103957 | A1 * | 4/2015 | Agar ...................... H04L 27/14 375/334 |

OTHER PUBLICATIONS

PCT, International Preliminary Report on Patentability, International Application No. PCT/US2011/029110 (Sep. 18, 2012).
PCT, International Search Report and Written Opinion, International Application No. PCT/US2011/029110 (May 23, 2011).
European Application No. 08772093.4, Search Report and Opinion, 9 pages, dated Mar. 7, 2014.
European Application No. 08772093.4, Examination Report, 6 pages, dated Apr. 14, 2016.
European Application No. 08772093.4, Examination Report, 7 pages, dated Nov. 30, 2016.
International Application No. PCT/US2008/068440, International Search Report, 1 page, dated Sep. 5, 2008.
International Application No. PCT/US2008/068440, International Preliminary Report on Patentability, 5 pages, dated Jan. 5, 2010.
International Application No. PCT/US2008/068444, International Search Report, 1 page, dated Sep. 3, 2008.
International Application No. PCT/US2008/068444, International Preliminary Report on Patentability, 6 pages, dated Jan. 5, 2010
U.S. Appl. No. 12/147,454, Non-Final Office Action, 8 pages, dated Nov. 21, 2011.
U.S. Appl. No. 12/147,454, Notice of Allowance, 7 pages, dated Jun. 4, 2012.
U.S. Appl. No. 12/147,469, Non-Final Office Action, 8 pages, dated Oct. 11, 2011.
U.S. Appl. No. 12/147,469, Notice of Allowance, 5 pages, dated May 2, 2012.
U.S. Appl. No. 13/632,279, Non-Final Office Action, 5 pages, dated Sep. 11, 2014.
U.S. Appl. No. 13/632,279, Notice of Allowance, 5 pages, dated Feb. 26, 2015.
U.S. Appl. No. 13/601,044, Non-Final Office Action, 20 pages, dated Apr. 6, 2015.
U.S. Appl. No. 13/601,044, Final Office Action, 29 pages, dated Jan. 7, 2016.
U.S. Appl. No. 13/601,044, Notice of Allowance, 10 pages, dated Jul. 20, 2016.
U.S. Appl. No. 13/601,044, Supplemental Notice of Allowance, 8 pages, dated Nov. 17, 2016.
EP, Partial Supplementary Search Report and Provisional Opinion Accompanying the Partial Search Results, European Application No. 11767363.2, 18 pages (Oct. 25, 2017).

* cited by examiner

FREQUENCY SHIFT KEYING MODULATION AND DEMODULATION

REFERENCE TO RELATED APPLICATIONS

The present application claims priority of U.S. Provisional Application Ser. No. 61/315,387, filed Mar. 18, 2010. The present application is related to U.S. Provisional Application Ser. No. 60/937,396, filed Jun. 26, 2007, U.S. Provisional Application Ser. No. 60/937,397, filed Jun. 26, 2007, U.S. Provisional Application Ser. No. 61/012,262 filed Dec. 7, 2007, and U.S. patent application Ser. No. 12/147,469 filed Jun. 26, 2008 and published as U.S. Patent Publication No. US 2009/0146502.

TECHNICAL FIELD

The systems and methods relate generally to the field of process control systems. More specifically, the disclosed systems and methods relate to devices, systems, and method for transmitting and receiving sensor data from field instruments.

BACKGROUND

Conventional process control systems generally include basic components for sensing, measuring, evaluating, and adjusting or otherwise controlling a variety of process variables. Additionally, common systems include components that provide means for communicating information about process control variables between sensing, measuring, or adjusting components and evaluation components. One such system for communicating information is a two-wire system that creates a loop that physically connects a sensing, measuring, evaluating, or adjusting device to a controller.

Sensing, measuring, evaluating, and/or adjusting devices in industrial production environments are generally referred to as field devices. Field devices commonly sense or monitor one or more process control variables such as temperature, pressure, or rate of fluid flow, among others. Many of these field devices can communicate information about the sensed or monitored variable to a process controller by regulating electrical current on the two-wire system. The controller in this type of environment can sense the electrical current, such as by using a current sense resistor, and translate the sensed magnitude of the current, as well as any sensed change of the current, into information about the sensed or monitored control variable. Many common field devices can receive information from the controller and effect changes or adjustments to the sensed or monitored control.

Two methods of communicating information using a multi-wire loop system include analog signaling methods, such as communicating information via an analog current signal, and digital signaling methods that can communicate information as a frequency shift keyed carrier signal which can be superimposed on, and coexist with, an analog signaling method on the multi-wire loop. One digital signaling method is the Highway Addressable Remote Transducer ("HART") communications protocol from the HART® Communication Foundation. As referred to herein, HART refers to any past or present version of the HART protocol, including Wireless HART, variants of such versions, as well as any future version that may be created so long as those future versions are compatible or can be modified to be compatible with the systems and methods disclosed herein.

SUMMARY

According to one embodiment, a communications adaptor can comprise a receiver circuit, which can comprise a signal input configured to receive a frequency shift keyed (FSK) signal; a delay circuit in communication with the signal input and including a delayed signal output; a multiplier circuit in communication with the signal input and the delayed signal output, and the multiplier circuit can be configured to produce a serial bit steam from at least the signal input and the delayed signal output, the serial bit stream corresponds to one or more bits encoded with frequency shift keying in the FSK signal; and a signal output configured to output the serial bit stream. The communications adaptor also can comprise a transmitter circuit and a processor in communication with the receiver circuit and the transmitter circuit.

The delay circuit of the communications adaptor can comprise a shift register. The shift register can further comprise a first receiver-transmitter configured to capture, in serial, a set of signal transitions of the FSK signal and output a byte-oriented data; a memory configured to receive the byte-oriented data from the first receiver/transmitter and output the byte-oriented data; and a second receiver/transmitter configured to input the byte-oriented data from the RAM and output, in serial, the byte-oriented data as the delayed signal output. The transmitter/receiver can be selected from the group consisting of a Universal Asynchronous Receiver Transmitter (UART), a Universal Synchronous Asynchronous Receiver Transmitter (USART), a microcontroller UART, and a microcontroller USART, and wherein the memory is selected from the group consisting of a Random Access Memory (RAM), a Static Random Access Memory (SRAM), a microcontroller SRAM, a Dynamic Random Access Memory (DRAM), and a microcontroller DRAM.

The signal output of the communications adaptor can further comprises a resistor-capacitor (RC) circuit.

The communications adaptor can further comprise a signal conditioning circuit configured to be coupled to a control loop and output the FSK signal. The signal conditioning circuit can further comprise a capacitor configured to capacitively couple the signal conditioning circuit to the control loop; a discriminator comparator circuit configured to produce a received signal strength indicator (RSSI) value and the FSK signal from a modulated signal on the control loop; and a carrier detect output configured to output a carrier detect signal based upon the RSSI value. The carrier detect signal can be a first binary value when the RSSI value is above a threshold value, and the carrier detect signal is a complementary second binary value when the RSSI value is below a threshold value; and wherein the processor is configured to use the carrier detect signal to perform an operation selected from the group consisting of a low power sleep operation and a wake operation. The threshold value can be about 80 mV.

The frequency shift keyed signal of the communications adaptor can be a Highway Addressable Remote Transducer ("HART") protocol.

The transmitter of the communications adaptor can further comprise an FSK signal input configured to receive a second FSK signal from the processor; and a signal conditioning circuit in communication with the FSK signal input, the signal conditioning circuit configured to be coupled to a control loop, the signal conditioning circuit configured to output the second FSK signal as a modulated signal on the control loop. The processor of the communications adaptor can further comprise a receiver-transmitter configured to provide a serial bit stream, the receiver transmitter selected from the group consisting of a UART, and a USART; a clock source configured to have a frequency that is a multiple of a first FSK frequency and a second FSK frequency; a timer configured to receive the clock source, the timer including a timer output that transitions from a first binary value to a second binary value when a count of clock cycles from the clock source is configured to cause an overflow condition in the timer; the timer is configured to be set with an initial count based at least in part upon a binary value of a bit in the serial bit stream; and a counter in communication with the timer and configured to output the second FSK signal, the second FSK signal including one or more pulses at a fixed pulse width, and wherein each of the pulses is triggered by a transition in the timer output. The fixed pulse width can be a pulse width derived from a fixed number of clock cycles of the clock source. The initial count can be selected from the group consisting of a first number associated with a first FSK frequency and a binary value of 0 of the bit in the serial bit stream, and a second number associated with a second FSK frequency and a binary value of 1 of the bit in the serial bit stream.

A method can comprise receiving an FSK signal associated with a communication from a field device; delaying the FSK to produce a delayed FSK signal; comparing the delayed FSK signal to the FSK signal to produce a demodulated serial bit stream from the FSK signal; and outputting the demodulated serial bit stream. The comparing of the method can include a binary exclusive OR operation.

The method can further comprise determining an RSSI value of the communication from the field device; entering a low power sleep mode of a processor associated with a communication adaptor as a result of the RSSI value being below a first threshold value; and waking a processor associated with the communications adaptor from the low power sleep mode as a result of the RSSI value being above a second threshold value.

The method can also further comprise receiving a serial bit stream to send to the field device; modulating the serial bit stream to produce an FSK modulated signal, wherein the operation of modulating further comprises: setting an initial timer value on a timer based at least in part upon a binary value of a bit in the serial bit stream, the initial timer value including a first value associated with a first FSK frequency, and a second value associated with a second FSK frequency; incrementing the timer based at least in part on clock cycles from a clock source until an overflow condition occurs, the clock source configured to have a frequency that is a multiple of the first FSK and the second FSK frequency; and producing a pulse at a fixed pulse width in the FSK modulated signal based at least in part upon an occurrence of the overflow condition in the timer; conditioning the FSK modulated signal to produce a conditioned FSK modulated signal; and coupling the conditioned FSK modulated signal to a control loop to send a communication from the communications adaptor to the field device.

An apparatus can comprise a receiver, a transmitter and a processor. The receiver can comprise a signal input; a capacitor configured to couple the signal input to a control loop to receive a first HART communication from a field device; a means to produce an RSSI signal and an FSK signal from the first HART communication; a carrier detect output configured to output a carrier detect signal based upon the RSSI value; a delay circuit configured to input the FSK signal from the signal input and output a delayed signal output; a logic gate configured to input the FSK signal from the signal input and the delayed signal output, and output a serial bit steam that corresponds to one or more bits encoded with frequency shift keying in the FSK signal; and a signal output configured to output the serial bit stream. The transmitter can comprise a signal conditioner configured to receive an FSK modulated output signal and output a second HART communication to the field device on the control loop. The processor can be in communication with the receiver and the transmitter, and the processor can be configured to transition between a low power sleep mode and a operating mode based at least in part upon the carrier detect signal.

The transmitter of the apparatus can further comprise a UART configured to output a serial bit stream including a message in a HART protocol; a clock source configured to output a clock signal at a frequency that is a multiple of a first FSK frequency and a second FSK frequency; a timer in communication with the clock source, the timer configured to increment a timer value based at least in part upon the clock signal until an overflow condition occurs, the timer configured to be set to an initial timer value based at least in part upon a bit of the serial bit stream, the initial timer value selected from the group consisting of a first value associated with the first FSK frequency and a first binary value of the bit, and a second value associated with the second FSK frequency and a second complementary binary value of the bit; and a counter in communication with the timer and configured to produce one ore more pulses at a fixed pulse width in the FSK modulated output signal based at least in part upon an occurrence of the overflow condition of the timer.

BRIEF DESCRIPTION OF THE DRAWINGS

While the specification concludes with claims particularly pointing out and distinctly claiming the present invention, it is believed that the same will be better understood from the following description taken in conjunction with the accompanying drawings in which:

FIG. 5b is a system block diagram of a shift register of the receiver circuit of FIG. 5a.

DETAILED DESCRIPTION

Most components and methods disclosed are described with reference to the drawings. In drawings, like reference numbers are used to refer to like elements throughout the drawings. In the following description, to aid in explanation, a number of specific details are provided to promote understanding of the disclosed subject matter. It may be evident, however, that certain of these specific details can be omitted or combined with others in a specific implementation. In other instances, certain structures and devices are shown in block diagram form in order to facilitate description. Further, it should be noted that although specific examples presented can include or reference specific components, a specific implementation of the components and methods disclosed and described is not necessarily limited to those specific examples and can be employed in other contexts as well. Those of ordinary skill in the art will readily recognize that the disclosed and described components and methods can be used to create other components and execute other methods in a wide variety of ways.

Figure 1:
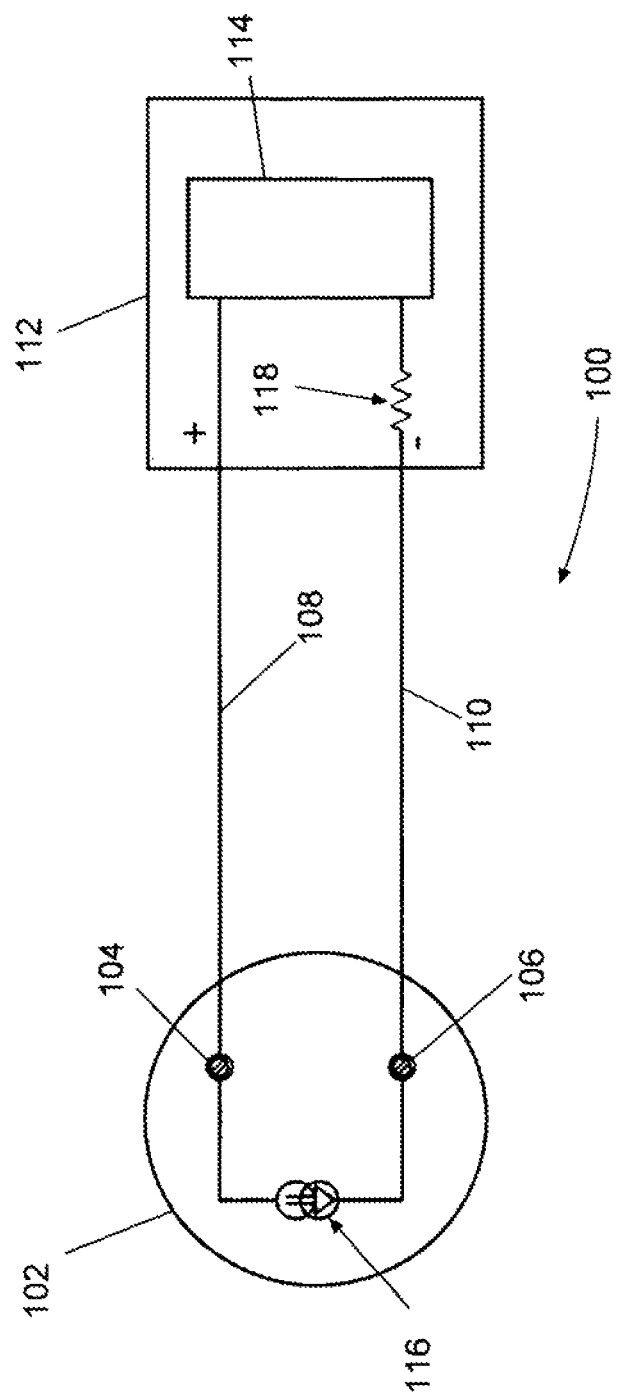
FIG. 1 is a system block diagram of a process control loop.

FIG. 1 is a system block diagram of a process control system 100. As illustrated, a field device 102 can include connection terminals 104, 106 to which control loop wires 108, 110 can be connected. A controller 112 can include a power supply 114 that is operable to supply electrical current (e.g., loop current) and voltage to the control loop wires 108, 110. In particular, a positive terminal of the power supply 114 can be in electrical communication with the control loop wire 108 and a negative terminal of the power supply 114 can be in electrical communication with the control loop wire 110. In one embodiment, the power supply 114 can produce loop current magnitudes levels from approximately 3.5 mA to approximately 20 mA during normal operation, with maximum current values as high as approximately 130 mA during maximum fault conditions. However, any of a variety of other current or voltage ranges may be provided by the power supply, such as may correspond with voltage and current parameters for a particular field device, for example.

In one embodiment, as illustrated in FIG. 1, the field device 102 can include a current regulator 116 that is operable to change amounts of loop current provided through the control loop wires 108, 110. Using the current regulator 116, the field device 102 can regulate the amounts of electrical current to communicate a control process variable to the controller 112. For example, if the field device 102 is configured to sense temperature, the current regulator 116 can regulate the amounts of current provided through the control loop wires 108, 110 to indicate the monitored temperature. It will be appreciated that any of a variety of suitable alternative embodiments can indicate a control process variable in the field device such as, for example, a current shunt, a voltage shunt, or the like.

In order to communicate the amount of current to the controller 112, in one embodiment, the controller 112 can include a current sense resistor 118 which can operate to sense the loop current provided through the control loop wires 108, 110. However, it will be appreciated that the controller 112 can sense loop current or other variables in any of a variety of suitable alternative configurations. Additionally or alternatively, the process control system 100 can include digital signaling components (not shown) to facilitate the communication of information as a carrier signal on the control loop wires 108, 110. In one embodiment, the field device 102 can include Highway Addressable Remote Transducer ("HART") communication components, such as wireless HART communication components. However, the process control system can include components for any of a variety of suitable alternative communication protocols such as, for example, ISA SP100 and Fieldbus among others.

Figure 2:
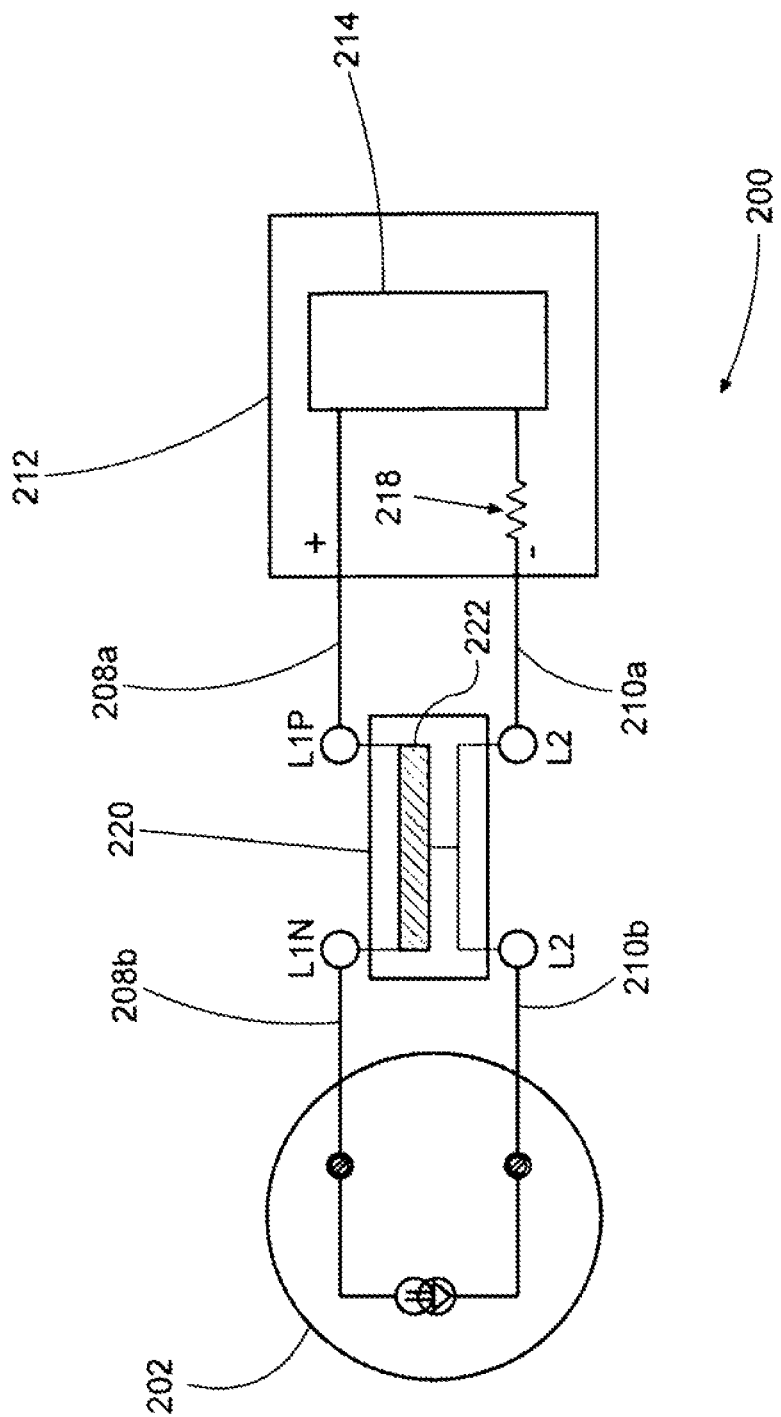
FIG. 2 is a system block diagram of a process control loop.

It will be appreciated that the process control system 100 can communicate with an associated network to provide information to a host controller. Conventionally, the controller 112 communicates with the associated network via wired communication. However, in some embodiments, the controller 112 may not support wired communication with the network (e.g., when digital signaling equipment is not present on the controller 112 or during failure of certain digital signaling equipment). Therefore, in one embodiment, as illustrated in FIG. 2, a wireless adapter device 220 can be included. As will be described in more detail below, the wireless adapter device 220 can include components and circuitry that are configured to provide wireless radio frequency ("RF") communications with an RF-based network in a facility that can communicate with a controller 212 or other suitable controllers. The wireless adapter device 220 can function as a gateway between components that can provide digital signaling for a field device 202 and a wireless communication network (not shown) in a facility. The controller 212 can be the controller 112 of FIG. 1 or as another suitable controller. The field device 202 can be the field device 102 depicted and described in FIG. 1 or can be another suitable field device.

Conventionally, the wireless adapter device 220 can be powered by dedicated power sources such as, for example, a separate wired power circuit, a battery, or a solar power cell, among others. However, installation and maintenance of a wireless adapter device 220 powered by these dedicated power sources can be costly and time consuming. Therefore, as illustrated in FIG. 2, the wireless adapter device 220 can provided in electrical communication with the control loop wires 208a, 208b, 210a, 210b such that the wireless adapter device 220 can be powered from loop current through the control loop wires 208a, 208b, 210a, 210b. In such an embodiment, the wireless adapter device 220 can include a power management circuit 222 provided between nodes L1P and L1N which can be connected in series with the control loop wires 208a and 208b. As described in more detail below, insertion power can be provided to the power management circuit 222 to power the wireless adapter device 220 without substantially interfering with the loop current. Accordingly, the wireless adapter device 220 can be powered by the process control system 200 without hindering the field device 202 from communicating a control process variable to the controller 212 (e.g., via current on loop wires 208a, 208b, 210a, 210b).

Figure 3:
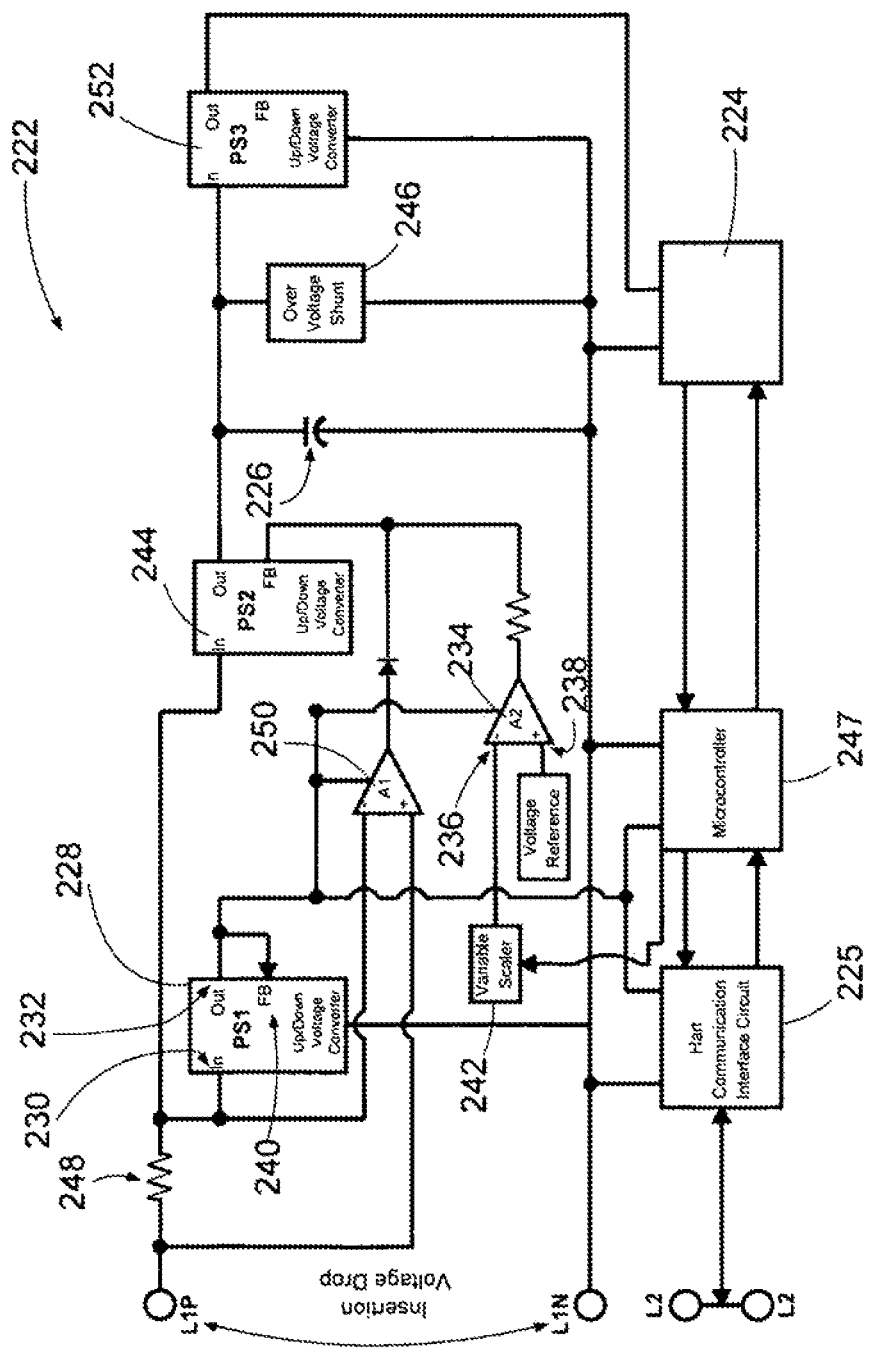
FIG. 3 is a system block diagram of a power management circuit.

FIG. 3 is a system block diagram of one embodiment of the power management circuit 222. It will be appreciated that, the power management circuit 222 can be used in any of a variety of process control systems such as illustrated in FIGS. 1 and 2, among other systems. The power management circuit 222 can be electrically connected between nodes L1P and L1N to facilitate the flow of loop current through the power management circuit 222 when the nodes L1P and L1N are connected in series with the loop wires 208a and 208b. The flow of loop current through the power management circuit 222 and can induce an insertion voltage across nodes L1P and L1N. Conventionally, this insertion voltage is insufficient to power the wireless adapter device 220. Therefore, the power management circuit 222 can include a voltage converter 228 connected to the insertion voltage at an input 230. An output 232 of the voltage converter 228 can be connected with certain electronic components of the wireless adapter device 220 such as an amplifier 234, a current loop amplifier 250, a HART interface logic device 225, and a microcontroller 247. The voltage converter 228 can convert the insertion voltage to an appropriate source voltage for powering each of the electronic components of the wireless adapter device 220.

The power management circuit 222 can include a wireless communication device 224. The wireless communication device 224 can be configured to provide wireless RF communications to transmit information (e.g., process variable information) between the wireless adapter device 220 and an RF based network in a facility. In certain embodiments, the wireless communication device 224 can include a transceiver that is supportive of any of a variety of wireless platforms such as IEEE 802.11, Bluetooth, microwave, infrared, or the like. In addition, the power management circuit 222 can further include HART interface logic 225 associated with the wireless communication device 224 to facilitate communication according to a HART protocol.

It will be appreciated that the power available from the loop current (e.g., insertion power) to power the wireless communication device 224 is generally the multiplicative product of the loop current and the insertion voltage. Typically, the wireless communication device 224 consumes more instantaneous power than is available as insertion power. The power management circuit 222 can include an electrical storage element device 226 that is configured to store insertion power and deliver the stored insertion power to the wireless communication device 224 as needed. Although the electrical storage device 226 is illustrated in FIG. 3 to comprise a supercapacitor, it will be appreciated that, any of a variety of alternative suitable electrical storage devices can be provided such as a general purpose energy storage capacitor or a battery, for example.

The electrical storage device 226 can be charged by a second voltage converter 244. As illustrated in FIG. 3, the electrical storage device 226 can be in electrical communication with output OUT of the second voltage converter 244. The second voltage converter 244 can transfer substantially all of the insertion power available, less the power consumed by the first voltage regulator 232, to charge the electrical storage device 226. Electrical energy can be provided from the electrical storage device 226 to meet the instantaneous and long term power requirements of the wireless communication device 224.

It will be appreciated that the storage capacity of the electrical storage device 226 can be many times greater than the insertion power such that charging of the electrical storage device 226 can take a relatively long period of time (potentially ranging from about one minute to a few hours). When the stored insertion power from the electrical storage device 226 becomes depleted, the voltage (e.g., radio voltage) of the electrical storage device 226 can also become depleted. To optimize the delivery of the stored insertion power from the electrical storage device 226 at a substantially constant voltage, the power management circuit 222 can include a third voltage converter 252 that is in electrical communication with each of the electrical storage device 226 and the wireless communication device 224. The third voltage converter 252 can generate a constant regulated radio voltage regardless of whether the electrical storage device 226 is charged to maximum capacity or is nearly depleted.

Conventionally, the insertion voltage has been regulated to a desired setpoint with a current shunt provided in parallel with the power management circuit 222. In such an arrangement, loop current is divided between the power management circuit 222 and the current shunt (e.g., a current divider circuit). If the loop current changes (e.g., due to a changing process variable), the current through the current shunt correspondingly changes to maintain the balance between the current shunt and the power management circuit thereby maintaining a constant insertion voltage drop. It will be appreciated however that any current that flows through the current shunt is not available to power the wireless adapter device and is wasted.

The second voltage converter 244 can be configured to regulate the insertion voltage without the need for a conventional-type current shunt. In some conventional configurations, voltage converters maintain a consistent voltage level at their output by varying the power transferred from their input. Generally, this conventional voltage regulator configuration is suitable where there is ample power provided at the input (e.g., to satisfy the power demands of a circuit electrically connected to the output of the voltage regulator). However, when the current and power provided at the input (e.g., input power) is limited, as is the case with the loop current into the power management circuit 222, and the demand on the output is higher than the input power, as is the case with the electrical storage device 226, a conventional voltage converter configuration may transfer too much power to the output thereby reducing the voltage at the input.

The second voltage converter 244, therefore, can be configured as a power converter to sense and control the insertion voltage at the input 230 and to balance the insertion power with the power transferred into the electrical storage device 226. In one embodiment, the insertion voltage can be compared with a reference voltage 238 to regulate the insertion voltage. For example, as illustrated in FIG. 3, the amplifier 234 can be in communication with a feedback input FB of the second voltage converter. A reference voltage is shown to be connected to a positive input 238 of the amplifier 234. A variable scaler 242 can be connected to a negative input 236 of the amplifier 234. The insertion voltage can be provided to the amplifier 234 through the variable scalar 242 and the amplifier 234 can compare it to the reference voltage. The amplifier 234 can provide a control signal to the feedback input FB to regulate the insertion voltage to the reference voltage. It will be appreciated, however, that a power converter can be provided in any of a variety of suitable alternative arrangements to maintain an insertion voltage drop at a particular level.

The power management circuit 222 is therefore configured to control the insertion voltage while allowing full loop current (less the miniscule current consumed by the other circuits) to flow to the electrical storage device 226 (e.g., to power the wireless adapter device 220). Accordingly, the second voltage converter 244 can overcome some of the shortcomings of using a conventional current shunt to regulate the insertion voltage. For example, the insertion power (less the miniscule power consumed by the other circuits) generated from the insertion voltage and the loop current can be delivered to the electrical storage device 226. When the loop current changes (e.g., when a control process variable changes), the change in power is transmitted to the electrical storage device 226 via the second voltage converter 244 (e.g., the power management circuit 222 can track and adapt in real-time).

It will be appreciated that the power management circuit 222 can be configured as an "Energy Pump" circuit which converts the insertion voltage to a higher voltage and can also charge the electrical storage device 226 to a higher voltage. Since the precise amount of energy transfer is monitored and compared against a reference voltage (e.g., by the amplifier 234) the insertion voltage can be precise (DC voltage) and stable (AC noise) during the operation of the field device 202. It will also be appreciated that the power extracted from the insertion voltage can be regulated to maintain the loop insertion voltage at a constant value.

The variable scaler 242 can vary the voltage provided to the negative input 236 of the amplifier 234 to facilitate selective control of the insertion voltage. By controlling the insertion voltage, the power provided to the electrical storage device 226 can change when the loop current changes (e.g., when the process variable changes). For example, when the loop current increases, the insertion voltage can be increased to increase the insertion power provided to the electrical storage device 226. By increasing the insertion power, the electrical storage device 226 can be charged quickly thereby increasing the power available from the electrical storage device 226 for operating the wireless communication device 224.

The variable scaler 242 can therefore be controlled to maximize the insertion power provided to the electrical storage device 226. In one example, for a field device (e.g., 202) that is configured to operate at a 1 Volt DC ("VDC") insertion voltage and at a minimum of 3.5 mA, the power management circuit 222 can provide more power to the electrical storage device 226 than would be available from a conventional current shunting system (e.g., 3.5 mW). If the loop current increases to 20 mA, the power management circuit 222 can generate 20 mW of insertion power, without the variable scaler 242 changing the 1VDC insertion voltage. However, if the variable scaler varies the insertion voltage to about 2.5 VDC, then the power management circuit 222 can generate about 50 mW of insertion power which, in some instances, is enough to power the wireless communication device 224 directly (e.g., without first charging the electrical storage device 226). It will be appreciated that a power management circuit can be configured to handle any of a variety of insertion voltages (e.g., 0.5VDC, over 2.5VDC).

In one embodiment, as illustrated in FIG. 3, the power management circuit 222 can include a microcontroller 247 coupled with the variable scaler 242. In one embodiment, the microcontroller 247 can control the variable scaler 242 based upon a predefined setpoint. In another embodiment, the microcontroller 247 can control the variable scaler 242 dynamically (e.g., according to an algorithm). It will be appreciated that the microcontroller 247 can include a microprocessor, an arithmetic logic unit, or any of a variety of other suitable electronic components. However, any of a variety of additional or alternative components can facilitate control of the variable scaler 242. It will be appreciated that the setpoint can be configured at time of installation, or can be dynamically configured such as with the microcontroller 247 or across a wireless communication network by a host system as required or desired.

It will be appreciated that the insertion voltage drop induced by the flow of current through the power management circuit 222 can provide an additional voltage drop to the process control system 200. When the wireless adapter device 220 is connected between nodes L1P and L1N, the magnitude of the insertion drop voltage should be such, that when the insertion drop voltage is combined with the other voltage losses in the process control system 200, the voltage of the power supply 214 is not exceeded. For example, the combined voltage losses across the loop wires 208a, 208b, 210a, 210b, the wireless adapter device 220, the field device 202, and the current sense resistor 218 should be maintained at or below the voltage of the power supply 214.

It will be appreciated that the voltage of the power supply 214 and corresponding voltage losses can vary for different process control system configurations. Conventionally, the insertion voltage drop on a power management circuit 222 is permanently set at a low level (e.g., about 1 VDC) in order to ensure compatibility with various process control system configurations. However, if these conventional power management circuits 222 are provided on a process control system with low cumulative voltage losses, insertion power can be lost. For example, if the power supply 214 can supply about a 5 VDC voltage, and the combined voltage losses of a process control system (ignoring the insertion voltage drop) total about 2 VDC, the process control system can accept an insertion voltage drop of up to about 3 VDC. However, if the insertion voltage drop of the conventional power management circuit has been set at about 1 VDC, the insertion power will be comparatively less than a conventional management circuit having an insertion voltage drop of about 3 VDC. Therefore, the power management circuit 222 can be configured to control the insertion voltage drop (e.g., stabilize, regulate) to maximize the insertion power for any of a variety of process control system configurations.

It will be appreciated that as the electrical storage device 226 reaches maximum capacity, the voltage across the electrical storage device 226 can rise above proper operating limits. Rather than shunting current and power away from the power management circuit 222 (e.g., with a current shunt), a voltage shunting circuit can be provided in communication with the electrical storage device 226. The voltage shunting circuit can be configured to prevent an over-voltage condition within the electrical storage device 226. In one embodiment, as illustrated in FIG. 3, a voltage shunt 246 can be provided in parallel with the electrical storage device 226, such that as the electrical storage device 226 reaches capacity, the voltage shunt 246 can bypass current and power to prevent the voltage across the electrical storage device 226 from further increasing. In such an embodiment, the power delivered from the output of the second voltage converter 244 (less the miniscule power consumed by the other circuits) can be shunted by the voltage shunt 246 to balance the power and regulate the voltage across the electrical storage device 226. As power is delivered from the electrical storage device 226 to the wireless communication device 224, the voltage shunt 246 can cease shunting until the electrical storage device 226 is at capacity again.

It will be appreciated to power various components of the power management circuit 222, a stable voltage can be provided from the insertion voltage drop. In one embodiment, as illustrated in FIG. 3, a third voltage converter 252 can be provided to create a constant regulated control voltage to power certain electronic components of FIG. 3.

The power management circuit 222 can provide fast deployment that allows the application of loop currents in excess of the loop current normal operating ranges (e.g., about 3.5-20 mA, up to about 130 mA). This fast deployment can allow a user installing wireless adapter device 220 to rapidly charge the electrical storage device to provide minimal delay after installation to power the wireless communication device 224. To facilitate this fast deployment, the power management circuit 222 includes a fast deployment circuit configured to sense a magnitude of the loop current, and when the magnitude of the loop current reaches a threshold value, maintain the voltage level at the input at an elevated level to facilitate a substantial increase in the charging power delivered to the electrical storage device 226. In one embodiment, the power management circuit 222 can include a sense resistor 248 and a loop current amplifier 250. The microcontroller 247 can monitor the loop current across the sense resistor 248 and compare it with a threshold value. When the magnitude of the loop current exceeds the threshold value, the microcontroller 247 can define a setpoint for maximum insertion voltage with using the variable scaler 242, and the power management circuit 222 can then receive maximum insertion power. In one embodiment, the microcontroller 247 can compare the loop current against a threshold value of 25 mA. When the loop current exceeds 25 mA for a period of time the variable scaler 242 can be set to provide a maximum insertion voltage drop.

The power management circuit 222 can include overcurrent protection. This over current protection can limit the amount of insertion power when an excessive amount of loop current is being provided to the power management circuit 222. To facilitate over-current protection the power management circuit 222 can include an over current protection circuit configured to sense the magnitude of the loop current and, when the magnitude of the loop current reaches an over-current threshold value, disable the second voltage converter 244. In one embodiment, over current protection circuit can include the sense resistor 248 and the loop current amplifier 250. The positive input and negative input of the loop current amplifier 250 can be electrically connected on opposite sides of the sense resistor 248 to monitor the magnitude of the loop current. If the loop current exceeds a maximum threshold, the output of the loop current amplifier can provide a signal to shut down the second voltage converter 244 thereby limiting the insertion power provided to the power management circuit 222. In one embodiment, the loop current amplifier 250 can compare the loop current against about a 130 mA threshold. When the loop current exceeds 130 mA, the loop current amplifier 250 can provide a signal to shut down the second voltage converter 244.

The power management circuit 222 can include a power save capability. The power management circuit 222 can monitor the loop current (e.g., through sense resistor 248). If the magnitude of the loop current is reduced to a negligible amount, the power management circuit 222 can power down all significant power consuming circuits to preserve the power stored in the electrical storage device 226. When the loop current regains a particular magnitude (e.g., greater than a negligible amount), the power management circuit 222 can return power to the circuits that were previously shut down. If a process control system has a power outage, this function can help ensure that the wireless adapter device 220 will be immediately available with the electrical storage device 226 at capacity when power returns. If a user has pre-charged the wireless adapter device 220 (e.g., in a lab), this feature can ensure that the wireless adapter device 220 will be fully powered and immediately available to begin radio communications when it is installed on a process control system.

The power management circuit 222 can include an instant-on function, whereby an auxiliary power is established to power the internal control circuitry before the electrical storage device 226 charges up.

The power management circuit 222 can include dynamic radio duty cycle management. In particular, the power management circuit 222 can inform a wireless communication network of the insertion power available to power the wireless communication device 224. Accordingly, the wireless communication network can dynamically configure a maximum radio duty cycle to match the insertion power available to power the wireless communication device 224. When the insertion power is elevated, a duty cycle can be increased to achieve faster update rates for changing process variables. However, when the insertion power is depleted, the duty cycle can be reduced to ensure that the power demand by the wireless communication network does not exhaust the storage capacity of the electrical storage device 226 thereby causing an ultimately loss of radio communication until the electrical storage device 226 can be recharged.

Referring again to FIG. 1, the wired-HART protocol communicates digital data between devices such as field devices 102 and controllers 112 using Frequency Shift Keying (FSK). The FSK is a modulation that is superimposed on top of the lower frequency analog control signal, namely the 4-20 ma signal commonly used by industrial measurement devices. This allows digital communications between devices 102, 112, without interfering with the main analog control signal. A WirelessHart Adapter can communicate data between a WirelessHART network and process control instruments using the communications adaptor 400 and the wired-HART protocol.

A typical approach to supporting the HART signaling is through the use of a HART modem IC, or integrated circuit, that modulates and demodulates the HART signal from a serial bit stream. These HART modem ICs are analog ASICs using a high precision clock source, with possible a precision Digital-to-Analog (DAC) converter to create the HART waveshape. However, the HART modem IC is active and consuming power even when no HART communications are taking place.

Figure 4:
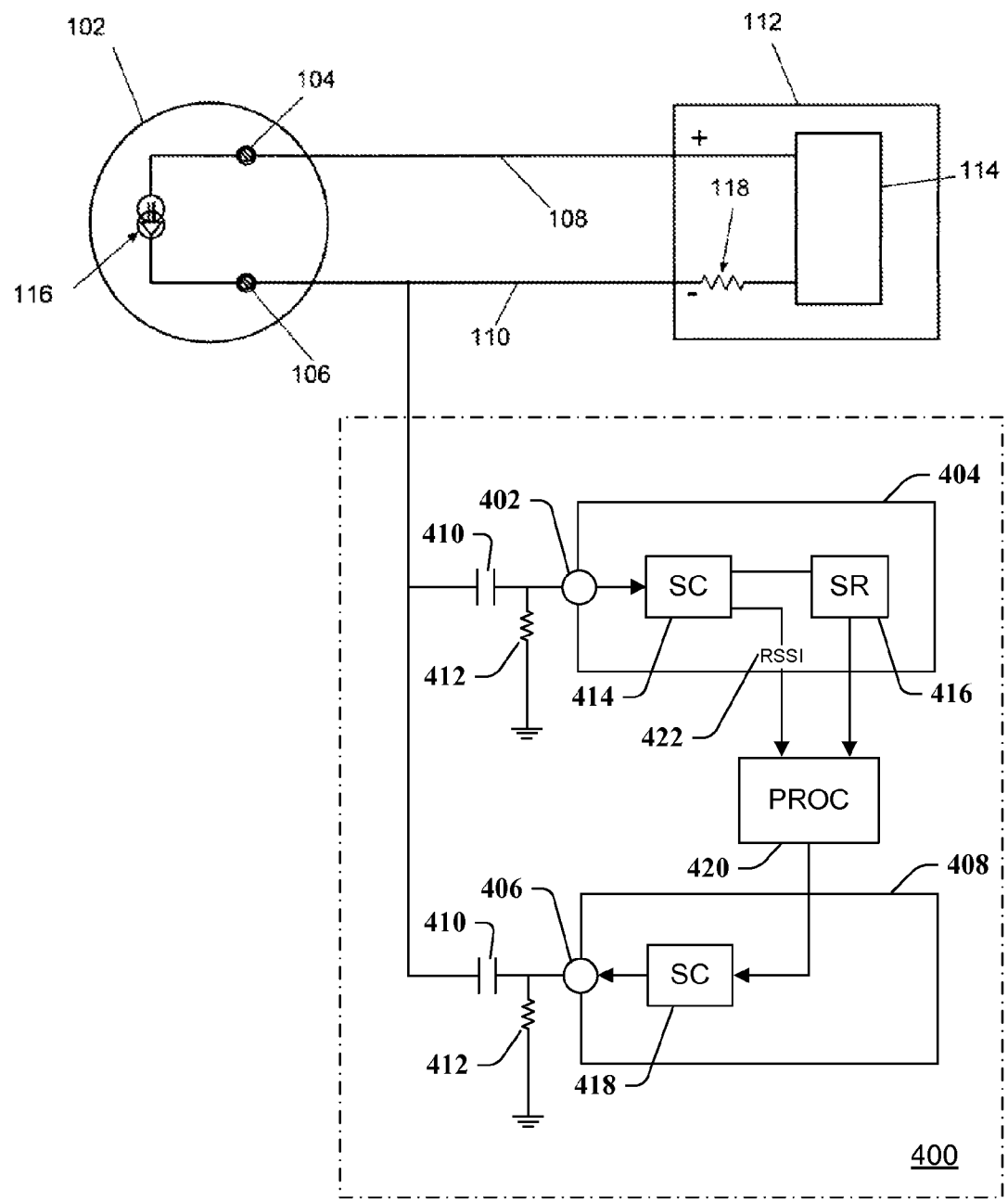
FIG. 4 is a system block diagram of a process control loop and a communications adapter.

Referring now to FIG. 4, a block diagram for communications adapter 400 interfacing with a process control loop 100 is presented. The elements shown in the process control loop 100 are similar to those described in the accompanying disclosure for FIG. 1 described above. The communications adaptor 400 advantageously uses discrete circuitry 404, 408, instead of the HART modem IC, thereby reducing power consumption. The discrete circuitry 404, 408 further reduces power consumption by allowing the processor 420 and the communications adaptor 400 to go into a low power sleep mode when no communications are present, therefore consuming minimal power. The communications adaptor 400 and processor are active and processing when a HART communication is detected, thereby increasing power consumption only when processing of HART communications is required.

Further, by implementing the HART FSK modulation and demodulation in discrete circuitry 404, 408, the necessary CPU cycles for the processor 420 are reduced, and are required when a full byte of information is ready to be processed, instead of requiring the processor 420 to process every bit individually. This can account for a 10-20 time decrease in the processing computation needed by the processor 420 to perform the software modulation and demodulation of an FSK signal.

The communications adaptor 400 can have a receiver, or receiver circuit 402, a transmitter, or transmitter circuit 408, and a processor 420.

The receiver circuit 402 can receive a HART FSK waveform, or HART communication, from a signal input 402 and shape the waveform at the same frequency as the FSK waveform. The signal input 402 of a receiver circuit 402 is in electrical communication with the control loop wire 110 through capacitor 410. The signal input 402 is also electrically connected to a pull down resistor 412 that is connected to ground. The capacitor 410 acts as a low pass filter, blocking the DC, or direct current, of the loop current, while allowing modulated signal to reach the signal input 402. The pull down resistor 412 is optional, but can help improve signal quality by providing a path to ground.

The field device 102 communicates with the communications adaptor 400 by modulating a serial bit stream, and coupling the modulated signal onto the control loop wire 110. The receiver 404 receives the modulated signal through the capacitor 410. The modulated signal is demodulated to recover the original serial bit stream. The receiver 404 can include a signal conditioning circuit 414 that receives the analog modulated signal and outputs a digital frequency shift keyed signal. The signal conditioning circuit 414 can convert the analog modulated signal into a digital frequency shift keyed signal using any means known in the art, for example using a discriminator comparator circuit or the equivalent. The signal conditioning circuit 414 receives the modulated signal from the control loop wire 110 and produces the FSK signal.

Figure 5A:
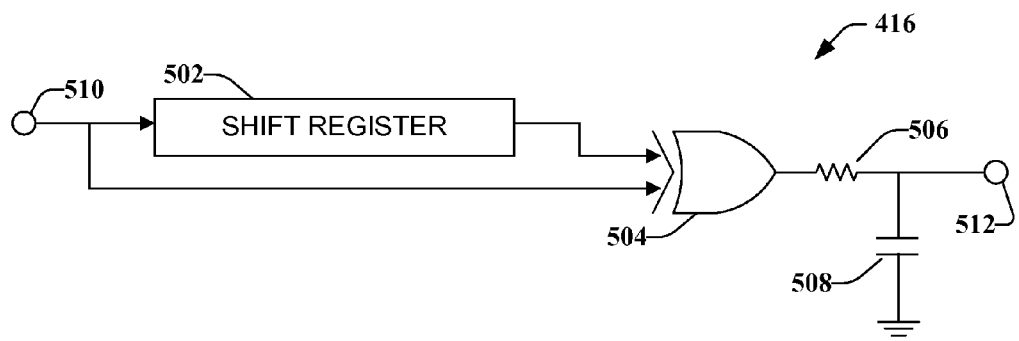
FIG. 5a is a system block diagram of a receiver circuit of the communications adapter of FIG. 4.

Referring now also to FIG. 5A, the FSK signal enters a delay circuit, or shift register 502, that delays the FSK signal producing a delayed FSK signal. A multiplier circuit, for example an exclusive-OR logic gate 504 combines the FSK signal and the delayed FSK signal and outputs the serial bit stream that was original modulated by the field device 102. The serial bit stream can filtered using a resistor 506 and capacitor 508 that function as a low pass filter, for example an RC filter having a cutoff frequency of 4.75 kHz. The delay circuit and multiplier circuit detect phase changes in the FSK signal, by delaying the input FSK signal for a period of time and multiplying it with the original non-delayed FSK signal. The delay time can be set to maximize the multiplier circuit's output difference between a first FSK frequency and a second FSK frequency. For example, a delay time of 450 microseconds can be used.

Figure 5B:
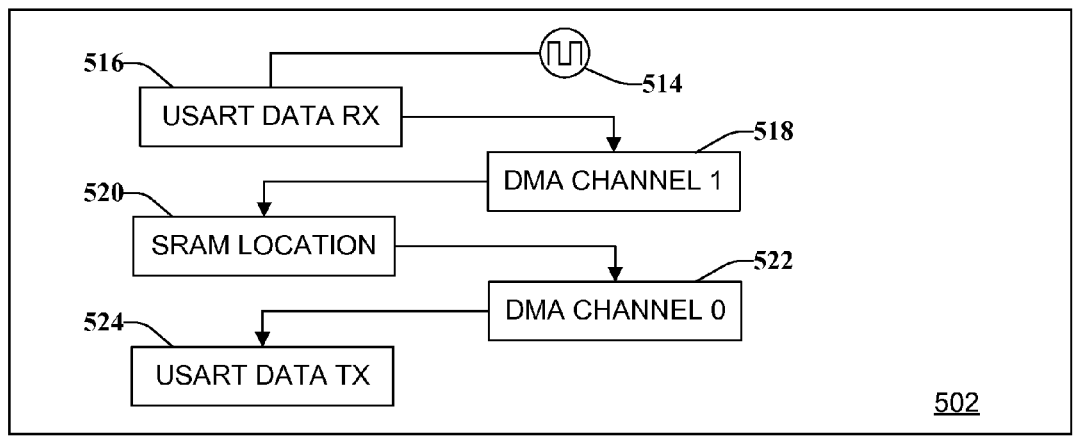

Referring now also to FIG. 5B, an example shift register 502 is shown. The shift register 502 has 24-bits. The shift register 502 comprises shift register clock 514. For example the shift register clock 514 can be a 55.55 kHz shift register clock 514. The FSK signal enters the first USART 516 which performs the function of a first serial shift register. The inputs to the USART 516 can be configured to sample the FSK signal on every clock edge of the shift register clock 514. After 8 bits, or a byte, are received, the data can be moved from the first USART 516 to a memory 520, for example a Random Access Memory (RAM), a Static Random Access Memory (SRAM), a microcontroller SRAM, a Dynamic Random Access Memory (DRAM), or a microcontroller DRAM. These data can be exchanged using, for example, the DMA channels 518, 522 of the processor 520. The data can then be moved from the memory 520 to the second USART 524. The data can be output from the second USART 524 on every clock edge. This data output from the second USART 524 is the delayed FSK signal. The first USART 516 and second USART 524 can be a Universal Asynchronous Receiver Transmitter (UART), a Universal Synchronous Asynchronous Receiver Transmitter (USART), a microcontroller UART, and a microcontroller USART.

The processor 420 can be any general processor, microprocessor, CPU, ASIC, or other processor. The processor 420 can bet set up to receive the serial bit stream from the receiver circuit 404, or to create the serial bit stream for the transmitter circuit 408. The processor 420, can have a standard UART that is set up at a baud or bit rate suitable for asynchronous communications with the field device 202. For wired HART communications the serial bit stream is a 1200 baud communication that is modulated using FSK modulation and demodulation.

Figure 6:
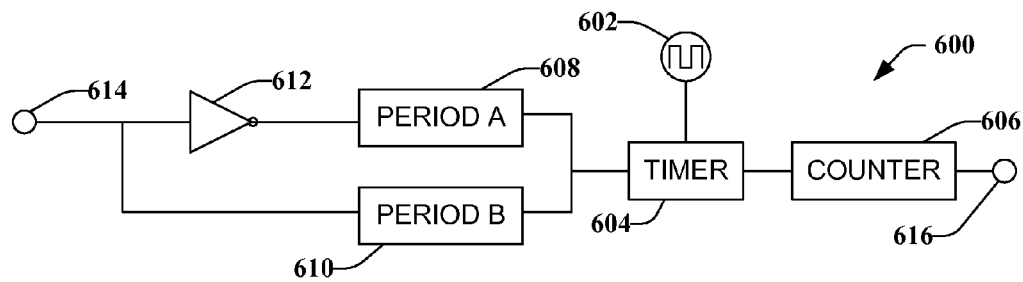
FIG. 6 is a system block diagram of a modulation circuit of the communications adaptor of FIG. 4.

Referring now also to FIG. 6, a diagram of a modulator 600 is presented. The modulator 600 can be implemented in discrete components. The modulator 600 can be implemented as software or firmware in the processor 420. The modulator 600 comprises an input 614 that can receive a serial bit stream from the UART of the processor 420. The serial bit stream from the input 614 can generate an event or interrupt on every edge transition of the serial bit stream using circuitry 608, 610, 612. The circuitry 608, 610, 612 can be used to reload a timer 604 with an initial timer value. The initial timer values can be values proportional to the frequency of the FSK signal to be generated, depending on the edge polarity of the serial bit stream, or can be another appropriate value. The values can be reloaded using the DMA controller and event system of the processor 420. The initial timer values can be 6 and 11.

The timer 604 is in communication with a clock source 602. The clock source 602 can be configured to output a clock signal at a frequency that is a multiple of the first FSK frequency and the second FSK frequency. The clock source 602 can be configure to output a 2 Mhz clock signal. The timer 604 will increment for each clock cycle of the clock signal. The timer 604 can be configured to toggle every time the timer 604 has an overflow event, or reaches an overflow value. Similarly, a count down method and an underflow event, or a count up to a particular value methodology can be used without departing from the scope of this disclosure. The timer 604 is in communication with a counter 606. The counter 606 can be configured to overflow at a defined rate. The counter 606 can be configured to overflow after the timer 604 toggles 76 times. The counter 606 produces a pulse having a fixed pulse width. The modulator 600 produces an FSK signal for outputting to the transmitter circuit 408. The output 616 of the modulator 600 is in communication with the transmitter circuit 408. If implemented in software, the output 616 of the modulator 600 can be a pin on the processor 420.

The transmitter circuit 408 can take a digital waveform, shape this as a HART communication, and couple it to the transmitter output 406. Similar to the signal input 402, the transmitter output 406 of the transmitter circuit 408, is connected to the control loop wire 110 through a capacitor 410, and is also electrically connected to a pull down resistor 412 that is connected to ground. Although the receiver circuit 404 and transmitter circuit 408 are illustrated connecting to control loop wire 110, in embodiments one or both of the receiver circuit 404 and transmitter circuit 408 can connect through either of control loop wires 108, 110. The receiver circuit 404 and transmitter circuit 408 can also be part of a common transceiver (not shown) that connects to the control loop wires 108, 110. The receiver circuit 404 and transmitter circuit 408 can also directly connect to a field device 102, and can include a current sense resister 118.

The signal conditioning circuit 414 can also produce a received signal strength indicator (RSSI) signal. The RSSI signal provides an indication of signal strength of the analog modulated signal. When an analog modulated signal is present, for example if the field device 102 is sending a communication to the communications adaptor 400, the RSSI signal will be high, for example one to several hundred millivolts. If no analog modulated signal is present, for example if the field device 102 is not sending a communication, the RSSI signal will be zero, or at a low value due to noise. The signal conditioning circuit 414 can compare the RSSI signal to a threshold value, for example approximately 80 millivolts. If the RSSI signal is above approximately 80 millivolts, the signal conditioning circuit 414 can assert a carrier detect signal out the carrier detect output 422 to the processor 420. The carrier detect signal can also be the RSSI signal or a binary signal. If the carrier detect output 422 is a binary signal, for example the carrier detect signal, then carrier detect signal can be asserted, for example, to wake the processor 420 from a low power sleep mode. If the carrier detect signal is low, the processor 420 can enter the low power sleep mode. If the carrier detect output 422 is an analog or RSSI signal, then the processor 420 can detect the level of the modulated signal.

The carrier detect output 422 can also be used in conjunction with current sense resistor 418. For example the carrier detect output 422 can be used to connect or disconnect the current sense resistor 418 to conserve energy, for example as part of the power cycling associated with the processor 420 entering the low power sleep mode. For example, a switch (not shown) can be placed in serial with the current sense resistor 418. When the switch is closed, power can flow from the loop control wires 108, 110 through the current sense resistor 418. When the switch is open, no current will flow.

What has been described above includes illustrative examples of certain components and methods. It is, of course, not possible to describe every conceivable combination of components or methodologies, but one of ordinary skill in the art will recognize that many further combinations and permutations are possible.

In particular and in regard to the various functions performed by the above described components, devices, circuits, systems and the like. The terms (including a reference to a "means") used to describe such components are intended to correspond, unless otherwise indicated, to any component which performs the specified function of the described component (for example, a functional equivalent), even though not structurally equivalent to the disclosed structure, which performs the function in the examples provided. In addition, while a particular feature may have been disclosed with respect to only one of several implementations, such feature may be combined with one or more other features of the other implementations as may be desired or advantageous for any given or particular application.

The foregoing description of embodiments and examples has been presented for purposes of illustration and description. It is not intended to be exhaustive or limiting to the forms described. Numerous modifications are possible in light of the above teachings. Some of those modifications have been discussed and others will be understood by those skilled in the art. The embodiments were chosen and described for illustration of various embodiments. The scope is, of course, not limited to the examples or embodiments set forth herein, but can be employed in any number of applications and equivalent devices by those of ordinary skill in the art. Rather it is hereby intended the scope be defined by the claims appended hereto.

What is claimed is:

1. A communications adaptor for interfacing with a control loop, wherein the control loop includes control loop wires providing an analog signal, the communications adapter comprising:
   a receiver circuit, comprising:
      a signal input configured to receive a frequency shift keyed (FSK) signal;
      a delay circuit in communication with said signal input and including a delayed signal output;
      a multiplier circuit in communication with said signal input and said delayed signal output, said multiplier circuit configured to produce a serial bit stream from at least said signal input and said delayed signal output, said serial bit stream corresponds to one or more bits encoded with frequency shift keying in said FSK signal;
      a first signal conditioning circuit configured to produce a received signal strength indicator (RSSI) signal that indicates a signal strength of said analog signal from the control loop, wherein said analog signal is indicative of whether a communication is being sent to said communications adapter; and
      a signal output configured to output said serial bit stream and said RSSI signal;
   a transmitter circuit including an FSK signal input and a second signal conditioning circuit, said second signal conditioning circuit in communication with said FSK signal input, said second signal conditioning circuit for communication with said control loop wires of said control loop; and,
   a processor in communication with said receiver circuit and said transmitter circuit, said processor configured to enter a low power sleep operation based on said RSSI signal indicating that the communication is not being sent to said communications adapter, wherein said FSK signal input is configured to receive a second FSK signal from said processor and said second signal conditioning circuit outputs said second FSK signal as a modulated signal that is superimposed on top of said analog signal carried by said control loop, and wherein said analog signal is a loop current.

2. The communications adaptor of claim 1, wherein said delay circuit comprises a shift register.

3. The communications adaptor of claim 2, wherein said shift register further comprises:
   a first receiver-transmitter configured to capture, in serial, a set of signal transitions of said FSK signal and output a byte-oriented data;
   a memory configured to receive said byte-oriented data from said first receiver/transmitter and output said byte-oriented data;
   a second receiver/transmitter configured to input said byte-oriented data from said memory and output, in serial, said byte-oriented data as said delayed signal output.

4. The communications adaptor of claim 3, wherein said transmitter/receiver is selected from the group consisting of a Universal Asynchronous Receiver Transmitter (UART), a Universal Synchronous Asynchronous Receiver Transmitter (USART), a microcontroller UART, and a microcontroller USART, and wherein said memory is selected from the group consisting of a Random Access Memory (RAM), a Static Random Access Memory (SRAM), a microcontroller SRAM, a Dynamic Random Access Memory (DRAM), and a microcontroller DRAM.

5. The communications adaptor of claim 1, wherein said signal output further comprises a resistor-capacitor (RC) circuit.

6. The communications adaptor of claim 1, wherein said first signal conditioning circuit further comprises:
   a capacitor configured to capacitively couple said second signal conditioning circuit to said control loop;
   a discriminator comparator circuit configured to produce said RSSI signal and said FSK signal from a modulated signal on said control loop;
   a carrier detect output configured to output a carrier detect signal based upon said RSSI signal.

7. The communications adaptor of claim 6, wherein said carrier detect signal is a first binary value when said RSSI signal is above a threshold value, and said carrier detect signal is a complementary second binary value when said RSSI value is below a threshold value; and wherein said processor is configured to use said carrier detect signal to perform an operation selected from the group consisting of the low power sleep operation and a wake operation.

8. The communications adaptor of claim 7, wherein said threshold value is about 80 mV.

9. The communications adaptor of claim 1, wherein said frequency shift keyed signal is a Highway Addressable Remote Transducer ("HART") protocol.

10. The communications adaptor of claim 1, wherein said processor further comprises:
- a receiver-transmitter configured to provide a serial bit stream, said receiver transmitter selected from the group consisting of a UART, and a USART;
- a clock source configured to have a frequency that is a multiple of a first FSK frequency and a second FSK frequency;
- a timer configured to receive said clock source, said timer including a timer output that transitions from a first binary value to a second binary value when a count of clock cycles from said clock source is configured to cause an overflow condition in said timer; said timer is configured to be set with an initial count based at least in part upon a binary value of a bit in said serial bit stream; and
- a counter in communication with said timer and configured to output said second FSK signal, said second FSK signal including one or more pulses at a fixed pulse width, and wherein each of said pulses is triggered by a transition in said timer output.

11. The communications adaptor of claim 10, wherein said fixed pulse width is a pulse width derived from a fixed number of clock cycles of said clock source.

12. The communications adaptor of claim 10, wherein said initial count is selected from the group consisting of a first number associated with the first FSK frequency and a binary value of 0 of said bit in said serial bit stream, and a second number associated with the second FSK frequency and a binary value of 1 of said bit in said serial bit stream.

13. The communications adaptor of claim 1, wherein said loop current is a 4-20 milliamp (mA) signal.

14. The communications adaptor of claim 1, wherein said second FSK signal is based on a Highway Addressable Remote Transducer ("HART") protocol.

* * * * *

UNITED STATES PATENT AND TRADEMARK OFFICE
CERTIFICATE OF CORRECTION

PATENT NO. : 9,860,093 B2
APPLICATION NO. : 13/698912
DATED : January 2, 2018
INVENTOR(S) : Kenneth Burns and Kenneth Malecek Page 1 of 1

It is certified that error appears in the above-identified patent and that said Letters Patent is hereby corrected as shown below:

Item (73) Assignee, reads:
"PEPPER+FUCHS GMBH"
It should read:
-- PEPPERL+FUCHS GMBH --

Signed and Sealed this
Seventeenth Day of April, 2018

Andrei Iancu
*Director of the United States Patent and Trademark Office*